United States Patent [19]
Graham et al.

[11] Patent Number: 4,846,941
[45] Date of Patent: * Jul. 11, 1989

[54] ELECTROPLATING BATH AND PROCESS FOR MAINTAINING PLATED ALLOY COMPOSITION STABLE

[75] Inventors: Arthur H. Graham, Chadds Ford, Pa.; Kenneth B. Keating, Wilmington, Del.

[73] Assignee: E. I. Du Pont de Nemours and Company, Wilmington, Del.

[*] Notice: The portion of the term of this patent subsequent to May 10, 2005 has been disclaimed.

[21] Appl. No.: 176,805

[22] Filed: Apr. 1, 1988

Related U.S. Application Data

[63] Continuation-in-part of Ser. No. 880,872, Jul. 1, 1986, Pat. No. 4,743,346.

[51] Int. Cl.$^4$ .................................................. C25D 3/56
[52] U.S. Cl. ................................................... 204/44.6
[58] Field of Search ...................................... 204/44.6

[56] References Cited

U.S. PATENT DOCUMENTS

| | | | |
|---|---|---|---|
| 3,054,733 | 9/1962 | Helling | 204/49 |
| 3,206,383 | 9/1965 | Kippel | 204/49 |
| 3,261,840 | 7/1966 | Kroll | 546/347 |
| 3,413,295 | 11/1968 | Passal | 546/346 |
| 3,432,509 | 3/1969 | Passal | 546/316 |
| 3,467,584 | 9/1969 | Lyons, Jr. | 204/32 |
| 3,500,537 | 3/1970 | Angus | 29/885 |
| 3,544,435 | 12/1970 | Angus | 204/47 |
| 3,669,851 | 6/1972 | Garvey | 204/25 |
| 3,671,409 | 6/1972 | Barrett | 204/49 |
| 3,726,768 | 4/1973 | Lundquist et al. | 204/1.5 |
| 3,933,602 | 1/1976 | Henzi et al. | 204/44 |
| 4,054,495 | 10/1977 | Law et al. | 204/49 |
| 4,098,656 | 7/1978 | Deuber | 204/47 |
| 4,234,396 | 11/1980 | Perakh et al. | 204/51 |
| 4,278,514 | 7/1981 | Morrissey | 204/47 |
| 4,297,177 | 10/1981 | Fletcher et al. | 204/44.6 |
| 4,299,672 | 10/1981 | Ehrich et al. | 204/44.6 |
| 4,463,060 | 7/1984 | Updegraff | 428/669 |
| 4,472,249 | 9/1984 | Chessin | 204/51 |
| 4,743,346 | 5/1988 | Graham et al. | 204/23 |

Primary Examiner—G. L. Kaplan
Attorney, Agent, or Firm—Barry Estrin

[57] ABSTRACT

A plating bath and process for electroplating coatings of palladium nickel alloys on a conductive substrate at current densities in the range of 10 amps/sq. ft. to 150 amps/sq. ft. wherein the palladium content of the alloy remains substantially constant despite current density variations during plating. The alloy composition stability is achieved by adding at least about 15 parts per million of iodate ions to the plating bath.

11 Claims, 3 Drawing Sheets

DEPICTION OF POSSIBLE MECHANISM FOR ALLOY CONSTANCY EFFECT

ELECTROPLATING BATH AND PROCESS FOR MAINTAINING PLATED ALLOY COMPOSITION STABLE

CROSS-REFERENCE TO RELATED APPLICATION

This application is a continuation-in-part of Ser. No. 880,872 filed July 1, 1986 and now U.S. Pat. No. 4,743,346.

BACKGROUND OF THE INVENTION

1. Field of the Invention

This invention relates to coatings of electroplated palladium-nickel alloys and in particular to a plating bath process for controlling the stability of the alloy composition in such coating over a wide variation of electroplating current densities.

2. Description of the Prior Art

Gold has historically been the plating material of choice for electrical contacts because of its resistance to corrosion, good solderability properties and low electrical contact resistance at low loads. Since gold platings are expensive, lower cost substitutes have been sought.

Alloys of palladium-nickel have shown much promise as a gold substitute for plating electrical contacts. One of the more successful such palladium-nickel coatings is described in U.S. Pat. No. 4,463,060 granted July 31, 1984 and assigned to the same assignee as the present invention, the disclosure of which is hereby incorporated herein by reference. The palladium-nickel electroplated surface coating described in this patent effectively protects the substrate from corrosion, is permanently solderable and exhibits reduced electrical contact resistance at low loads.

The coatings in the aforenoted U.S. Pat. No. 4,463,060 patent are prepared by electroplating in a bath of palladium (II) ammine chloride, nickel ammine sulfate, a small amount of brighteners, and a conductive salt. Electroplating is carried out at a current density ranging from about 5 to 25 amps/sq.dm., or 50 to 250 amps/sq.ft. (asf). At current densities in the upper portion of this range, above about 100 asf, the Pd-Ni composition of the plated coating can be fairly readily controlled. As current densities decrease below this level, controlling the alloy composition becomes increasingly difficult.

Controlling the Pd-Ni alloy composition during electroplating is extremely important. The properties of Pd-Ni alloy coatings which are important for electronic connector applications, such as solderability, ductility, hardness, thermal stability of contact resistance and environmental corrosion resistance, vary significantly with fluctuation in electroplated alloy composition. Accurate control of the level and constancy of plated Pd-Ni alloy composition is therefore necessary to assure the desired properties of connector products.

Other plated connector performance criteria, such as absence of porosity and wear life, are strong functions of the precious metal alloy thickness. All widely used, nondestructive, production techniques for measurement of precious metal alloy coating thickness, such as electron backscatter spectroscopy and x-ray fluorescence, must be standardized for a specific alloy composition. Therefore, in the production of Pd-Ni alloy plated connector products, the stability of the alloy composition is also necessary to achieve the desired control of alloy coating thickness and the properties that are thickness-dependent.

Of particular concern is the stability of the alloy composition as a function of current density. In the commercial plating of formed terminals, there can be variations in current density as high as a factor of four depending upon location on the connector. The magnitude of the current density variation is dependent upon the part geometry, the plating cell design, and other factors. A typical range of current densities for most formed terminals is 25–100 asf. Locations on a few terminals might be plated as low as 10 asf or as high as 150 asf.

The effects of current density variation upon alloy composition stability can be better explained with reference to FIG. 1 and Examples 1–3 below. For the purpose of this invention, the stability parameter for evaluation of Pd-Ni alloy plating process performance is defined as the difference between the Pd content in weight percent of an alloy deposited at 100 asf and that for an alloy deposited at 25 asf. This difference, which is illustrated for Curve A on FIG. 1, will be referred to and indicated by the symbol $\Delta$ Wt% $Pd_{(100\text{-}25)}$. Plating baths formulated with typical commercially available palladium ammine chloride salts and organic brightener systems have a $\Delta$ Wt% $Pd_{(100\text{-}25)}$ in the approximate range of 12 to 22 as shown in Examples 1, 2, and 3. In Example 1, identical plating runs with respect to bath chemistry and plating conditions were conducted with palladous ammine dichloride salts from six different commercial sources. The $\Delta$ Wt% $Pd_{(100\text{-}25)}$ for these runs ranged from 13.0 to 18.7, indicating that they were all unstable with respect to the desired constancy of alloy composition.

SUMMARY OF THE INVENTION

In the preferred embodiments of this invention, the palladium-nickel alloy plating baths have $\Delta$ Wt% $Pd_{(100\text{-}25)}$'s in the range of 0 to 6. This is based upon the discovery that the intentional addition of iodide ions to palladium-nickel alloy plating baths results in a pronounced improvement in process stability as indicated by a significant decrease in the $\Delta$ Wt% $Pd_{(100\text{-}25)}$ parameter. It has also been discovered that the intentional addition of iodate ions to such baths will likewise improve the process stability. Purification of palladium salts to remove certain chemical species that promote instability is also important and is necessary to achieve the ultimate in stability [$\Delta$ Wt% $Pd_{(100\text{-}25)} = 0$].

DESCRIPTION OF THE PREFERRED EMBODIMENTS

As noted above, the addition of iodide or iodate ions to the palladium-nickel alloy plating bath has a pronounced effect on controlling the plated alloy composition. This is demonstrated by a significant decrease in the $\Delta$ Wt% $Pd_{(100-25)}$ parameter.

Figure 1:
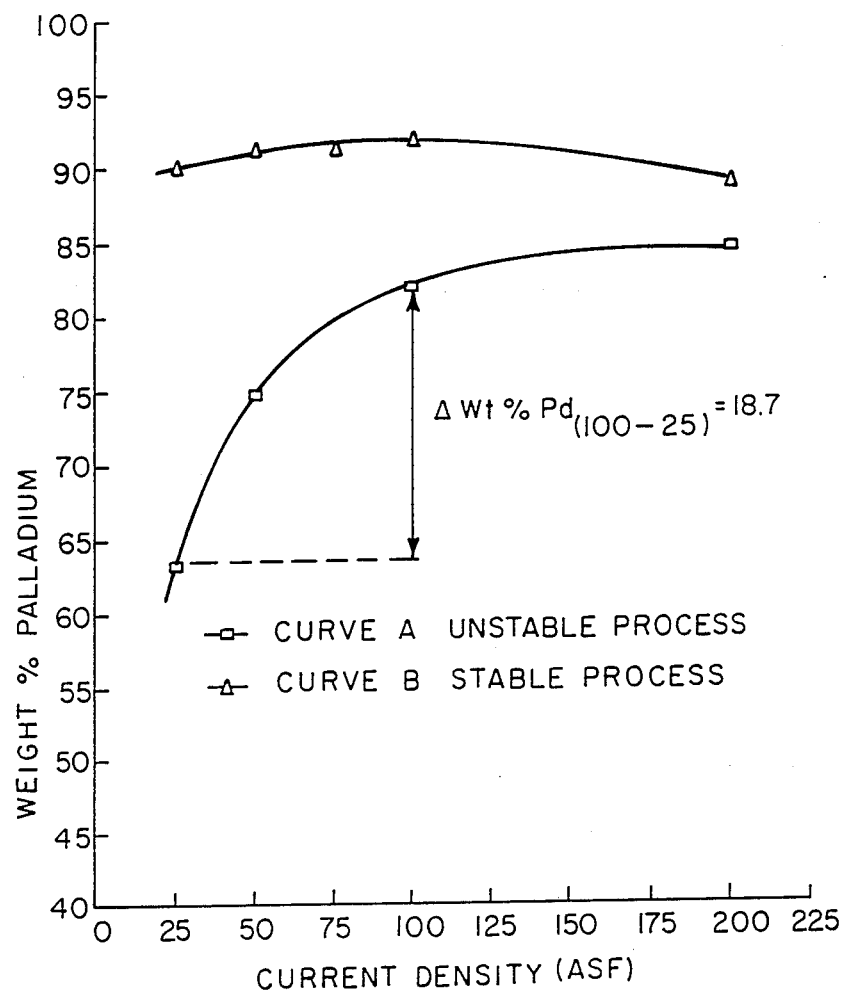
FIG. 1 is a graph illustrating the effects of current density variation upon Pd-Ni alloy composition stability, wherein Curve A represents plating run V of Example 1 and Curve B illustrates the beneficial effects of a 15 ppm iodide addition according to the present invention as demonstrated by Example 4.

For palladium-nickel alloy plating baths that do not contain organic brighteners, the addition of as little as 15 ppm of iodide ion can result in a $\Delta$ Wt% $Pd_{(100-25)}$ of 2.0, as demonstrated in Example 4, below. The alloy composition versus current density plot for the 15 ppm run in Example 4 appears as Curve B in FIG. 1. Curve A in FIG. 1 is for an identical plating run in terms of process chemistry and operating conditions except that a sodium vinyl sulfonate brightener was used instead of iodide ions (see Example 1, Plating Run V). The replacement of iodide ions with sodium vinyl sulfonate resulted in an increase in $\Delta$ Wt% $Pd_{(100-25)}$ to 18.7.

Iodide ions act as a brightener when added to a palladium-nickel alloy plating bath containing no organic additives. The iodide ion addition not only results in the plating of a mirror bright coating, but it also increases the maximum current density for the deposition of smooth, dense, nonporous coatings.

Additions of small amounts of iodate ions will also significantly reduce $\Delta$ Wt% $Pd_{(100-25)}$. For example, the addition of as little as 15 ppm of iodate ion to a palladium-nickel alloy plating bath containing an organic brightener such as sodium vinyl sulfonate as described in Example 16 will reduce the $\Delta$ Wt% $Pd_{(100-25)}$ stability parameter from 16.7 to 7.8. When the amount of iodate ions added is raised to 100 ppm, the stability parameter is reduced further to 4.2 in Example 16. When no organic brightener is used, such as in the bath of Example 17, additions of 15 ppm and 100 ppm of iodate ions reduce the $\Delta$ Wt% $Pd_{(100-25)}$ stability parameter to 7.6 and 7.8, respectively. Moreover, as with iodide ion addition, the iodate ions also appear to act as a brightener since the coatings of Example 17 all have a bright, mirror-like appearance.

Figure 2:
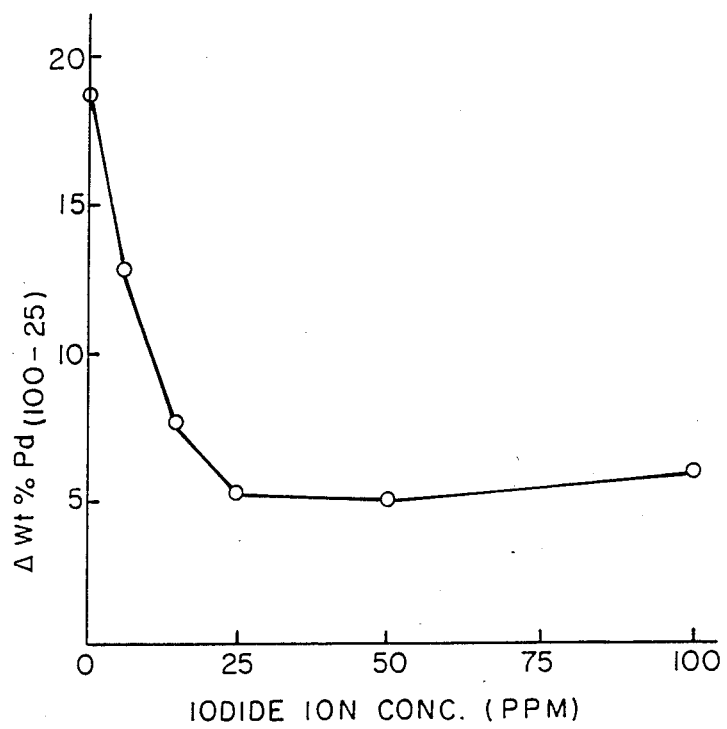
FIG. 2 is a graph illustrating the Pd-Ni alloy stability as a function of the iodide ion concentration used in the plating run of Example 5.

For palladium-nickel alloy plating processes based on certian organic brighteners, such as aliphatic sulfonic acids, the addition of small amounts of iodide ion is very effective in promoting process stability. This fact is illustrated in Example 5, which shows the effect of iodide ion additions ranging from 6 to 100 ppm on the constancy of alloy composition plated by a process based on a sodium vinyl sulfonate brightener. The stability parameter for runs in Example 5 plotted versus iodide ion concentration appears in FIG. 2. These data indicate that an addition of only 25 ppm of iodide ions was sufficient to decrease $\Delta$ Wt% $Pd_{(100-25)}$ from 18.7 to a plateau level of about 5.

For palladium-nickel alloy plating processes based on other organic brighteners such as quaternized pyridines, larger additions of iodide ions are required to improve process stability. This is illustrated by Example 6, which shows the effect of iodide ion additions ranging from 23 to 300 ppm on the constancy of alloy composition plated by a process based on technical grade N-benzyl niacin internal salt as brightener. This salt is CAS Registry No. 15990-43-3-pyridinium 3-carboxy-1-(phenylmethyl)hydroxide inner salt, and will be referred to subsequently as "pyridinium salt." The addition of 300 ppm of iodide ion decreased the $\Delta$ Wt% $Pd_{(100-25)}$ for this process from 16.9 to 11.7. Additional improvements in the constancy of the alloy composition plated by this process could be achieved by decreasing the concentration of "pyridinium salt" and by the removal of impurities in the brightener, some of which might be promoting instability.

The effect of palladium salt purification is shown by Examples 7, 8 and 9, below. Palladium salts used in Examples 7, 8 and 9 were purified by utilizing the fact that palladium diammine chloride, $Pd(NH_3)_2Cl_2$, is insoluble in water and will form a precipitate when a solution of palladium tetrammine chloride is treated with an excess of hydrochloric acid, as per the following reaction:

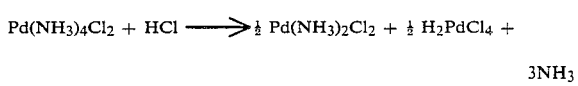

$$3NH_3$$

Ammonia is liberated and chloropalladous acid is formed.

Palladium diammine chloride, however, can be solubilized by treating with ammonia (dissolving in $NH_4OH$), as follows:

Palladium tetrammine chloride salt is readily solubilized in water.

Thus, to purify further a purchased palladium tetrammine salt, the following procedure was used:
 (a) Dissolve the palladium tetrammine salt, $Pd(NH_3)_4Cl_2$, in deionized water.
 (b) Precipitate the palladium diammine chloride, $Pd(NH_3)_2Cl_2$, by adding an excess of hydrochloric acid.
 (c) Filter the precipitate from the mother liquor and wash several times with deionized water.
 (d) Redissolve the precipitated palladium diammine chloride in $NH_4OH$, again forming a solution of palladium tetrammine chloride.

To purify further a purchased palladium diammine chloride salt, the procedure was as follows:
 (a) Dissolve the palladium diammine chloride salt in $NH_4OH$, forming a solution of the palladium tetrammine chloride.
 (b) Precipitate the diammine chloride by adding an excess of hydrochloric acid.
 (c) Filter the precipitated palladium diammine from the mother liquor and wash several times with deionized water.

Based on the above, one cycle of purification is defined as the series of steps which will repeat the chemical identity of the original entity treated (e.g., palladium diammine chloride back to palladium diammine chloride). A palladium balance made on this series of steps verified the above stoichiometry.

It is well known to those skilled in the art of chemical synthesis that precipitation (recrystallization) will tend to purify the precipitated product, rejecting impurities to the supernatant mother liquor. Besides this method of purification, other methods of purification will suggest themselves to those skilled in the art, such as reaction of an aqueous solution of the palladium salt with hydrogen peroxide (especially for organic impurities), or passing the palladium solution through a bed of palladium powder, carbon treatment, etc. It should be noted that some purification methods may also remove the iodide ions as well as the undesired impurities which promote instability. In such cases, iodide ions must be added to the requisite concentration after purification. Strict control of the impurity content of all other ingredients of the palladium-nickel bath is also necessary.

Examples 8 and 9 also show the powerful effect of purification by precipitation as described above combined with the addition of iodide to the palladium-nickel plating bath. A one-cycle purification of a palladous tetrammine chloride salt, formulated into a plating bath with the addition of 31 ppm iodide ion resulted in a $\Delta Pd_{(100-25)}$ of 4.2. When a similar plating bath was formulated with a palladous tetrammine chloride salt purified through two cycles of purification (35 ppm iodide added) $\Delta Pd_{(100-25)}$ was 0.4, essentially a constant alloy composition over the current density range of 25 asf to 100 asf.

The present invention has broad applicability with respect to all palladium-nickel alloy plating processes. The effectiveness of iodide additions in establishing constancy of plated alloy composition in the range of current densities from 25 to 100 amps/sq.ft. has been demonstrated for a variety of nickel salt types (see Example 10), different conductive salts (see Example 11), a broad range of agitation levels (see Example 12), and a broad range of Pd/Ni molar concentration ratios which result in the deposition of a broad range of alloy compositions (see Examples 13, 14 and 15). Also, the iodide addition appears effective over the typical pH range of about 7–9 normally employed in commercial plating baths.

Figure 3:
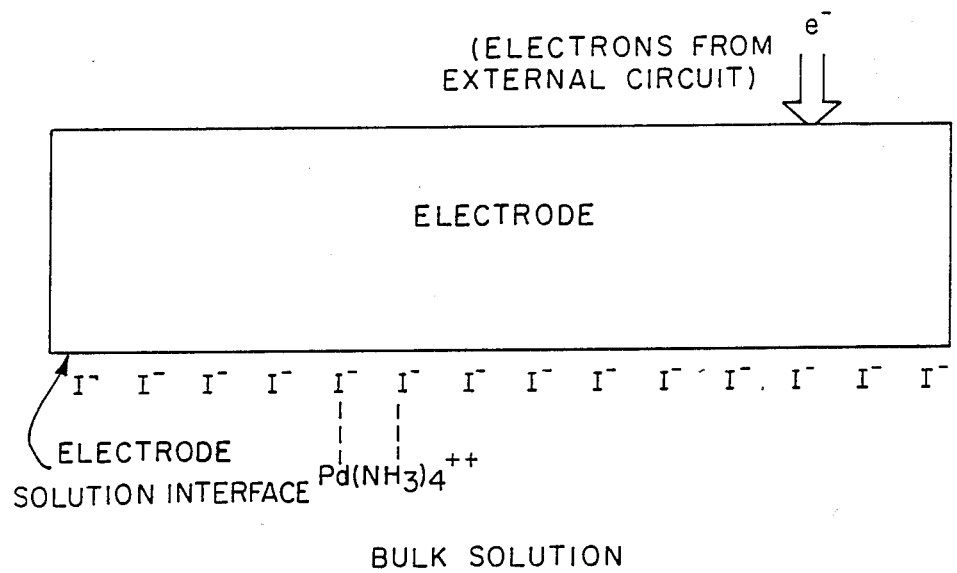
FIG. 3 is a schematic illustrating a possible mechanism at the electrode interface which may contribute to the constancy effect on the Pd-Ni alloy composition.

The elements of a possible mechanism to explain this constancy effect on alloy composition are shown in FIG. 3. During electroplating, the connector terminal acts as a solid cathode electrode to which the palladium-nickel alloy is to be electroplated. An adsorbed surface layer of iodide ion forms an effective "bridge" for the palladium ion in the bath, probably the $Pd(NH_3)_4^{++}$ ion, to transfer charges to the electrode. The iodide ion, however, does not offer an effective "bridge" to the nickel ion species. This "ligand-bridging" effect has been described in the literature. In essence, such a "bridge" eases the transfer of charge to or from the target ion (in this case, the palladium ion) by both adsorbing on the electrode and also inserting itself into the coordinating sphere of the target ion.

This effect, which is a differential one in that, as stated above, the iodide ion does not offer as effective a bridge for the nickel species as it does for the palladium species, might be written as follows:

1. $M + X^- \longrightarrow M(X^-)_{ads.}$

2. $M(X^-)_{ads} + Pd(NH_3)_4^{++} \longrightarrow [M\cdots X\cdots Pd(NH_3)_3]^+ + NH_3$

3. $[M\cdots X\cdots Pd(NH_3)_3]^+ + 2e^- \longrightarrow Pd^o + 3NH_3 + M(x^-)_{ads.}$

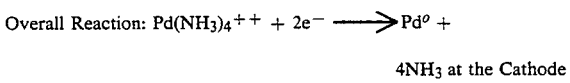

Overall Reaction: $Pd(NH_3)_4^{++} + 2e^- \longrightarrow Pd^o +$

4NH$_3$ at the Cathode

In the above representation, M is the metal cathode electrode, $X^-$ is iodide ion used to obtain the compositional constancy effect and the entity in the brackets represents the bridge formed by the iodide ion between the metal and the palladium species. The kind of coordination represented here is sometimes referred to an "inner sphere" mechanism because at least one ligand is shared, that is, it belongs simultaneously to both coordination shells.

It should also be noted that irrespective of whether one initially adds iodide ions or iodate ions, the electrochemical reactions at the anode and the cathode will continuously recycle these ions. For example, the iodate ion is reduced under cathodic conditions to iodide ion:

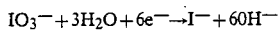

$IO_3^- + 3H_2O + 6e^- \longrightarrow I^- + 6OH^-$

At the anode, the reaction is reversed:

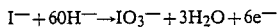

$I^- + 6OH^- \longrightarrow IO_3^- + 3H_2O + 6e^-$

What is important is that iodide ions are available for adsorption at the cathode which is the connector terminal being plated.

Adsorption of the iodide ion will be facilitated if the cathode is at a potential more positive than its point of zero charge (PZC). At more positive potentials than the PZC, the electrode surface has a net positive charge; at more negative potentials than the PZC, it has a net negative charge.

The above described mechanism is consistent with the observed role of purification in enhancing this effect (see Examples 7, 8 and 9). Purification, as practiced in the examples in this patent, would tend to remove adsorbable substances from the bath (by virtue of their removal from the palladium source) which might compete with iodide (say, surface-active agents) for sites at the electrode but which would not offer a bridge to the palladium. It is apparent that different substances will vary greatly in the extent to which they will compete with iodide for sites at the surface. Thus, the presently accepted theories of the action of surface-active agents would suggest that more hydrophobic agents would compete more effectively for sites at an electrode surface immersed in an aqueous solution and thus tend to diminish the effectiveness of iodide in maintaining compositional constancy. This is seen in the results for the "pyridinium salt" in which a quantity of this substance in the bath which is far less, on a molar basis, than typical additions of sodium vinyl sulfonate, reduces the effectiveness of the iodide (see Example 6). In fact, its deleterious effect could not be completely overcome by substantial additions of iodide. This finding also indicates that a surface effect is involved since, if the effect were a bulk effect, constancy destabilization induced by the quaternized pyridine should have been "neutralized" by the large additions of iodide. In general, the degree of hydrophobicity can be correlated with the relative quantity of organic character in the molecule in question. Where there is no competition at all from deliberately added substances, the iodide ion alone is more effective in maintaining composition constancy than in the presence of sodium vinyl sulfonate (see Example 4).

Another key property of surface-active agents, aside from their degree of hydrophobicity, which could have a profound effect on their competition with iodide, would be the charge on the surface-active moiety; a positively-charged active moiety might neutralize the iodide effect by creating competition between itself and the palladium ion for iodide.

Since this model depends on at least a surface layer of coverage of iodide on the cathode electrode surface, the optimum concentration of iodide in the bulk solution (whether due initially to addition of iodide ions, iodate ions, or both) may differ under differing conditions of plating, mass transfer, etc.

EXAMPLES

The following specific examples describe the invention in greater detail. All examples were carried out on copper alloy disks that had been subjected to conventional preplate treatments as practiced in the art. The disks were then electroplated with a pure nickel coating by a conventional nickel sulfamate plating process. The nickel undercoat prevents copper contamination of certain palladium-nickel plating baths, but it is not necessary to the practice of the invention. The nickel-plated surfaces were activated by immersion in a 20 volume % solution of sulfuric acid prior to palladium-nickel alloy plating. Both the nickel plating and the palladium-nickel alloy plating steps were conducted in a conventional rotating-disk-electrode plating apparatus at speeds of rotation ranging from 100 to 500 rpm.

The palladium-nickel alloy coating thicknesses were 60 μin. which is sufficient to permit accurate composition analysis using an Energy-Dispersive X-ray Analysis (EDXA) technique with an accelerating voltage for exciting electrons of 20 kV.

EXAMPLE 1

This example illustrates the typical instability of the composition of palladium-nickel alloys deposited by a process formulated with palladium salts obtained from a variety of commercial sources. Plating baths having the same composition were formulated with palladium salts from six different sources as described in Table I.

TABLE I

| Plating Run Code | Palladium-Salt Description | |
|---|---|---|
| | Source Code | Salt Type |
| I | A | Tetrammine dichloride |
| II | B | Tetrammine dichloride |
| III | C | Diammine dichloride |
| IV | D | Diammine dichloride |
| V | E | Tetrammine dichloride |
| VI | F | Diammine dichloride |

The plating process composition and plating conditions were as follows:

| Bath Chemistry | |
|---|---|
| Pd concentration: | 20 g/l from salts cited in Table I |
| Ni concentration: | 10 g/l as nickel ammine sulfate |
| Sodium vinyl sulfonate: | 2.8 g/l |
| Ammonium sulfate: | 50 g/l |
| Ammonium hydroxide: | Quantity sufficient to achieve desired pH. |
| Plating Conditions | |
| Temperature: | 48° C. |
| pH: | 8.5 (adjusted by addition of NH$_4$OH or HCl) |
| Speed of disk rotation: | 500 rpm |

Disks were plated with palladium-nickel alloy coatings at current densities ranging from 25 to 200 amp/sq.ft. from six baths of the composition cited above, each bath being formulated with one of the six different palladium salts cited in Table I. The results of coating alloy compositions analyses appear in Table II. The alloy composition stability parameter [Δ Wt% Pd$_{(100-25)}$] for the six plating baths ranged from 13.0 to 18.7.

TABLE II

Plated Pd—Ni Alloy Composition in Weight % Pd* at Indicated Current Density

| Plating Run Code | 25 asf | 50 asf | 75 asf | 100 asf | Δ Wt % Pd$_{(100-25)}$ |
|---|---|---|---|---|---|
| I | 67.3 | 77.3 | — | 84.3 | 17.0 |
| II | 74.3 | 80.8 | — | 87.3 | 13.0 |
| III | 69.5 | 77.4 | 80.3 | 83.8 | 14.3 |
| IV | 66.3 | 76.2 | 79.8 | 83.4 | 17.1 |
| V | 63.4 | 75.0 | — | 82.1 | 18.7 |
| VI | 62.4 | 66.4 | 75.6 | 80.2 | 17.8 |

*Note: Balance, nickel.

EXAMPLE 2

Palladium-nickel alloy coatings were electrodeposited on disks at current densities ranging from 25 to 200 asf using the bath chemistry and plating conditions set forth below:

| Bath Chemistry | |
|---|---|
| Pd concentration: | 17.0 g/l as palladous tetrammine dichloride |
| Ni concentration: | 11.0 g/l as nickel ammine chloride |
| Sodium vinyl sulfonate: | 2.8 g/l |
| Ammonium sulfate: | 50 g/l |
| Ammonium hydroxide: | Quantity sufficient to achieve desired pH. |
| Plating Conditions | |
| Temperature: | 48° C. |
| pH: | 8.0 |
| Speed of rotation: | 500 rpm |

Results for coating composition analyses as a function of current density appear in Table III. The process had a Δ Wt% Pd$_{(100-25)}$ parameter of 21.4.

TABLE III

| Current Density (asf) | Pd—Ni Alloy Composition | |
|---|---|---|
| | Wt % Pd | Wt % Ni |
| 25 | 47.3 | 52.7 |
| 50 | 54.9 | 45.1 |
| 75 | 62.5 | 37.5 |
| 100 | 68.7 | 31.3 |
| 200 | 77.0 | 23.0 |

EXAMPLE 3

Palladium-nickel alloy coatings were electrodeposited on disks at current densities ranging from 25 to ⑧asf using the bath chemistries and plating conditions set forth below:

| Bath Chemistry | |
|---|---|
| Pd concentration: | 15.0 g/l as palladous tetrammine dichloride |
| Ni concentration: | 7.5 g/l as nickel chloride |
| "Pyridinium salt": | 0.6 g/l |
| Ammonium chloride: | 30 g/l |
| Ammonium hydroxide: | Quantity sufficient to achieve desired pH. |
| Planting Conditions | |
| Temperature: | 48° C. |
| pH: | 8.5 |
| Speed of rotation: | 500 rpm |

Results for coating composition analyses as a function of current density appear in Table IV. The process had a $\Delta$ Wt% $Pd_{(100\text{-}25)}$ of 16.9.

TABLE IV

| Current Density (asf) | Pd—Ni Alloy Composition | |
|---|---|---|
| | Wt % Pd | Wt % Ni |
| 25 | 64.5 | 35.5 |
| 50 | 72.1 | 27.9 |
| 75 | 77.4 | 22.6 |
| 100 | 81.4 | 18.6 |
| 200 | 84.2 | 15.8 |

EXAMPLE 4

This example illustrates the beneficial effect of iodide ion addition to a palladium-nickel alloy plating bath significantly improving the constancy of alloy composition. Palladium-nickel alloy coatings were electrodeposited on disks at current densities ranging from 25 to 200 asf from plating baths containing 15 and 50 ppm of iodide ions, and from 10 to 200 asf from a plating bath containing 25 ppm iodide. The basic bath chemistry and plating conditions were as follows:

| Bath Chemistry | |
|---|---|
| Pd concentration: | 20 g/l as palladous tetrammine dichloride |
| Ni concentration: | 10 g/l as nickel ammine sulfate |
| Ammonium sulfate: | 50 g/l |
| Ammonium hydroxide: | Quantity sufficient to achieve desired pH. |
| Plating Conditions | |
| Temperature: | 48° C. |
| pH: | 8.5 |
| Speed of rotation: | 500 rpm |

Coating composition analyses as a function of current density and iodide ion concentration level appear in Table V. The plating bath containing 15 ppm iodide had a $\Delta$ Wt% $Pd_{(100\text{-}25)}$ of 2.

TABLE V

| Iodide Ion Concentration ppm | Plated Pd—Ni Alloy Composition in Weight % Pd* at Indicated Current Density | | | | | | $\Delta$ Wt % $Pd_{(100\text{-}25)}$ |
|---|---|---|---|---|---|---|---|
| | 10 asf | 25 asf | 50 asf | 75 asf | 100 asf | 200 asf | |
| 15 | — | 90.1 | 91.3 | 91.5 | 92.1 | 89.1 | 2.0 |
| 25 | 87.2 | 89.8 | 90.8 | — | 91.7 | 87.8 | 1.9 |
| 50 | — | 90.9 | 91.8 | 92.2 | 92.6 | 89.7 | 1.7 |

*Note: Balance, nickel.

EXAMPLE 5

This example illustrates the beneficial effect of iodide ion addition to a palladium-nickel alloy plating bath containing sodium vinyl sulfonate in significantly improving the constancy of alloy composition. Palladium-nickel coatings were electrodeposited on disks at current densities ranging from 25 to 100 asf from plating baths containing 0, 6, 15, 25, 50 and 100 ppm of iodide ion. The basic bath chemistry and plating conditions were as follows:

| Bath Chemistry | |
|---|---|
| Pd concentration: | 20 g/l as palladous tetrammine dichloride |
| Ni concentration: | 10 g/l as nickel ammine sulfate |
| Sodium vinyl sulfonate: | 2.8 g/l |
| Ammonium hydroxide: | Quantity sufficient to achieve desired pH. |
| Plating Conditions | |
| Temperature: | 48° C. |
| pH: | 8.5 |
| Speed of rotation: | 500 rpm |

The stability parameters [$\Delta$ Wt% $Pd_{(100\text{-}25)}$] determined as a function of iodide ion concentration level appear in Table VI. The addition of 25 ppm of iodide ion decreased the $\Delta$ Wt% $Pd_{(100\text{-}25)}$ from 18.7 to 5.2.

TABLE VI

| Iodide Ion Concentration ppm | $\Delta$ Wt % $Pd_{(100\text{-}25)}$ |
|---|---|
| 0 | 18.7 |
| 6 | 12.8 |
| 15 | 7.6 |
| 25 | 5.2 |
| 50 | 5.0 |
| 100 | 5.9 |

EXAMPLE 6

This example illustrates the beneficial effect of iodide ion addition to a palladium-nickel alloy plating bath containing a quaternized pyridine in improving the constancy of alloy composition. Palladium-nickel coatings were electrodeposited on disks at current densities ranging from 25 to 100 asf from plating baths containing 0, 23, 100 and 300 ppm of iodide ion. The basic bath chemistry and plating conditions were as follows:

| Bath Chemistry | |
|---|---|
| Pd concentration: | 15.0 g/l as palladous tetrammine dichloride |
| Ni concentration: | 7.5 g/l as nickel chloride |
| "Pyridinium salt" | 0.6 g/l |
| Ammonium hydroxide: | Quantity sufficient to achieve desired pH. |
| Plating Conditions | |
| Temperature: | 48° C. |
| pH: | 8.5 |
| Speed of rotation: | 500 rpm |

The stability parameters [$\Delta$ Wt% $Pd_{(100\text{-}25)}$] determined as a function of iodide ion concentration appear in Table VII. The addition of 300 ppm of iodide ion decreased the $\Delta$ Wt% $Pd_{(100\text{-}25)}$ from 16.9 to 11.7.

TABLE VII

| Iodide Ion Concentration ppm | $\Delta$ Wt % $Pd_{(100\text{-}25)}$ |
|---|---|
| 0 | 16.9 |
| 23 | 15.5 |
| 100 | 13.9 |
| 300 | 11.7 |

EXAMPLE 7

This example illustrates the beneficial effect of palladium salt purification in improving the constancy of composition of electrodeposited palladium-nickel alloys. Part of a shipment of a lot of commercially available palladous tetrammine dichloride salts was purified by one recrystallization cycle as described above. Palladium-nickel alloy coatings were electrodeposited on disks at current densities ranging from 25 to 100 asf from a bath formulated with the as-received palladium salt and a bath of identical basic chemistry formulated with the purified palladium salts under the same plating conditions. The basic bath chemistry and plating conditions were identical to those for Example 1. The iodide ion concentrations for the baths were <1 ppm. The process formulated with the as-received palladium salt had a stability parameter of 18.7 whereas that formulated with the purified salt had a stability parameter of 14.5.

EXAMPLE 8

This example illustrates the beneficial effect of iodide ion addition and palladium salt purification on the constancy of the composition of electrodeposited palladium-nickel alloys. A sample of palladous tetrammine chloride salt was purified through one recrystallization cycle as described earlier. Palladium-nickel alloys were plated on disks at current densities ranging from 25 to 100 asf using a bath chemistry and plating conditions set forth below:

| Bath Chemistry | |
|---|---|
| Pd concentration: | 20 g/l |
| Ni concentration: | 10 g/l as nickel ammine sulfate |
| Sodium vinyl sulfonate: | 2.8 g/l |
| Iodide ion: | 31 ppm |
| Ammonium sulfate: | 50 g/l |
| Ammonium hydroxide: | Quantity sufficient to achieve desired pH. |
| Plating Conditions | |
| Temperature: | 48° C. |
| pH: | 8.5 |
| Speed of rotation: | 500 rpm |

The $\Delta$ Wt % $Pd_{(100-25)}$ for the process was 4.2.

EXAMPLE 9

This example illustrates the beneficial effect of iodide ion addition and palladium salt purification on the constancy of the composition of electrodeposited palladium-nickel alloys. A sample of palladous tetrammine chloride salt was purified through two recrystallization cycles as described earlier. Palladium-nickel alloys were plated on disks at current densities ranging from 25 to 100 asf using a bath chemistry and plating conditions set forth below:

| Bath Chemistry | |
|---|---|
| Pd concentration: | 20 g/l |
| Ni concentration: | 10 g/l as nickel ammine sulfate |
| Sodium vinyl sulfonate: | 2.8 g/l |
| Iodide ion: | 35 ppm |
| Ammonium sulfate: | 50 g/l |
| Ammonium hydroxide: | Quantity sufficient to achieve desired pH. |
| Plating Conditions | |
| Temperature: | 48° C. |
| pH: | 8.5 |
| Speed of rotation: | 500 rpm |

The $\Delta$ Wt % $Pd_{(100-25)}$ for the process was 0.4.

EXAMPLE 10

Palladium-nickel alloy coatings were electrodeposited on disks at current densities ranging from 25 to 100 asf under identical operating conditions from baths that were formulated with three different types of nickel salts, an ammine sulfate, a sulfate, and a chloride. The palladium salt, other basic process chemistry parameters, and plating conditions were identical to those for Example 8. The constancy of palladium alloy composition for the three different types of nickel salt appear in Table VIII.

TABLE VIII

| Nickel Salt Type | $\Delta$ Wt % $PD_{(100-25)}$ |
|---|---|
| Ammine sulfate | 4.2 |
| Sulfate | 2.8 |
| Chloride | 2.3 |

EXAMPLE 11

Palladium-nickel alloy coatings were electrodeposited on disks at current densities ranging from 25 to 100 asf under identical operating conditions from baths that were formulated with two different types of conductive salts. The palladium salt, other basic process chemistry parameters, and plating conditions were identical to those for Example 8. The constancy of palladium alloy composition for the two different types of conductive salts appear in Table IX.

TABLE IX

| Conductive Salt Type | $\Delta$ Wt % $Pd_{(100-25)}$ |
|---|---|
| Ammonium sulfate | 4.2 |
| Ammonium Chloride | 0.8 |

EXAMPLE 12

This example illustrates the effectiveness of iodide ion additions in achieving constancy of palladium-nickel alloy composition as a function of current density for a range of agitation levels. Palladium-nickel alloys were plated on disks rotated at speeds of 100 and 500 rpm using a bath chemistry and plating conditions set forth below:

| Bath Chemistry | |
|---|---|
| Pd concentration: | 20 g/l as palladous diammine dichloride |
| Ni concentration: | 10 g/l as nickel ammine sulfate |
| Sodium vinyl sulfonate: | 2.8 g/l |
| Iodide ion conc.: | 31 ppm |
| Ammonium sulfate: | 50 g/l |
| Ammonium hydroxide: | Quantity sufficient to achieve desired pH. |
| Plating Conditions | |
| Temperature: | 48° C. |
| pH: | 8.6 |
| Current Density: | 25 asf and 100 asf |

For a speed of rotation of 100 rpm, the $\Delta$ Wt % $Pd_{(100-25)}$ was 3.2. For a speed of rotation of 500 rpm, the $\Delta$ Wt % $Pd_{(100-25)}$ was 2.8.

EXAMPLE 13

This example illustrates the beneficial effects of iodide ion addition in improving the constancy of the composition of palladium-nickel alloys electrodeposited from a bath having palladium-to-nickel molar concentration ratios of 0.86. Palladium-nickel alloys were plated on disks at current densities ranging from 25 to 100 asf using a bath chemistry and plating conditions set forth below:

| Bath Chemistry | |
|---|---|
| Pd concentration: | 17.0 g/l as palladous diammine dichloride |
| Ni concentration: | 11.0 g/l as nickel ammine sulfate |
| Sodium vinyl sulfonate: | 2.8 g/l |
| Ammonium sulfate: | 50 g/l |
| Ammonium hydroxide: | Quantity sufficient to achieve desired pH. |
| Plating Conditions | |
| Temperature: | 48° C. |
| pH: | 8.0 |
| Speed of rotation: | 500 rpm |

At the completion of the initial plating run, 100 ppm of iodide ion was added to the plating bath and a second set of disks was plated with palladium-nickel alloys at the same current density settings. The results of coating alloy composition analyses for the runs before and after the addition of iodide ions appear in Table X.

TABLE X

| Bath Iodide Ion Concentration, ppm | Plating Pd—Ni Alloy Composition in Weight % Pd* at Indicated Current Density | | | |
|---|---|---|---|---|
| | 25 asf | 50 asf | 75 asf | 100 asf |
| 0 | 47.3 | 54.9 | 62.5 | 68.7 |
| 100 | 75.8 | 77.1 | 76.5 | 77.3 |

*Note: balance, nickel.

The presence of 100 ppm of iodide ion in the plating bath decreased the $\Delta$ Wt% $Pd_{(100-25)}$ from 21.4 to 1.5.

EXAMPLE 14

This example illustrates the beneficial effects of iodide ion addition in improving the constancy of the composition of palladium-nickel alloys electrodeposited from a bath having palladium-to-nickel molar concentration ratio of 0.55. Palladium-nickel alloys were plated on disks at current densities ranging from 25 to 100 asf using a bath chemistry and plating conditions set forth below:

| Bath Chemistry | |
|---|---|
| Pd concentration: | 15.6 g/l as palladous diammine dichloride |
| Ni concentration: | 15.4 g/l as nickel ammine sulfate |
| Sodium vinyl sulfonate: | 2.8 g/l |
| Ammonium sulfate: | 50 g/l |
| Ammonium hydroxide: | Quantity sufficient to achieve desired pH. |
| Plating Conditions | |
| Temperature: | 48° C. |
| pH: | 8.5 |
| Speed of rotation: | 500 rpm |

At the completion of the initial plating run, 100 ppm of iodide ion was added to the plating bath and a second set of disks was plated with palladium-nickel alloys at the same current density settings. The results of coating alloy composition analyses for the runs before and after the addition of iodide ions appear in Table XI.

TABLE XI

| Bath Iodide Ion Concentration, ppm | Plating Pd—Ni Alloy Composition in Weight % Pd* at Indicated Current Density | | | |
|---|---|---|---|---|
| | 25 asf | 50 asf | 75 asf | 100 asf |
| 0 | 48.4 | 56.7 | 63.2 | 66.5 |
| 100 | 68.4 | 66.9 | 65.0 | 70.9 |

*Note: balance, nickel.

The presence of 100 ppm of iodide ion in the plating bath decreased the $\Delta$ Wt% $Pd_{(100-25)}$ from 18.1 to 2.5.

EXAMPLE 15

This example illustrates the beneficial effects of iodide ion addition in improving the constancy of the composition of palladium-nickel alloys electrodeposited from a bath having a low palladium-to-nickel molar concentration ratio of 0.24. Palladium-nickel alloys were plated on disks at current densities ranging from 25 to 100 asf using a bath chemistry and plating conditions set forth below:

| Bath Chemistry | |
|---|---|
| Pd concentration: | 7.4 g/l as palladous diammine dichloride |
| Ni concentration: | 17.0 g/l as nickel ammine sulfate |
| Sodium vinyl sulfonate: | 2.8 g/l |
| Iodide ion conc.: | 11 ppm |
| Ammonium sulfate: | 50 g/l |
| Ammonium hydroxide: | Quantity sufficient to achieve desired pH. |
| Plating Conditions | |
| Temperature: | 48° C. |
| pH: | 8.0 |
| Speed of rotation: | 500 rpm |

At the completion of the initial plating run, 89 ppm of iodide ion was added to the plating bath and a second set of disks was plated with palladium-nickel alloys at the same current density settings. The results of coating alloy composition analyses for the runs before and after the addition of iodide ions appear in Table XII.

TABLE XII

| Bath Iodide Ion Concentration, ppm | Plating Pd—Ni Alloy Composition in Weight % Pd* at Indicated Current Density | | | |
|---|---|---|---|---|
| | 25 asf | 50 asf | 75 asf | 100 asf |
| 11 | 20.6 | 21.2 | 28.3 | 38.5 |
| 100 | 33.6 | 35.1 | 37.8 | 43.0 |

Note: balance, nickel.

The addition of 89 ppm of iodide ion in the plating bath decreased the $\Delta$ Wt% $Pd_{(100-25)}$ from 17.9 to 9.4.

EXAMPLE 16

This example illustrates the beneficial effect of iodate ion additions in significantly improving the constancy of palladium-nickel alloy composition electrodeposited from baths containing sodium vinyl sulfonate as an organic brightener. All baths were formulated with the same lot of a commercially available palladium diammine dichloride salt. Palladium-nickel alloy coatings were electrodeposited onto disks at current densities ranging from 25 to 100 asf from baths containing 0, 15 and 100 ppm of iodate ions added as the sodium salt. The basic chemistry and plating conditions were as follows:

| Bath Chemistry | |
| --- | --- |
| Pd concentration: | 20 g/l as palladium diammine dichloride |
| Ni concentration: | 10 g/l as nickel ammine sulfate |
| Sodium vinyl sulfonate: | 2.8 g/l |
| Ammonium sulfate: | 50 g/l |
| Ammonium hydroxide: | quantity sufficient to achieve desired pH |
| Plating Conditions | |
| Temperature: | 48° C. |
| pH: | 8.5 |
| Speed of disk rotation: | 500 rpm |

Coating composition analyses as a function of current density and iodate ion addition level appear in Table XIII. The process without an addition of iodate ions had a $\Delta$ Wt% $Pd_{(100-25)}$ stability parameter of 16.7; whereas, the $\Delta$ Wt% $Pd_{(100-25)}$ for the process with 100 ppm of iodate ions was only 4.2.

TABLE XIII

| Iodate Ion Addition ppm | Plated Pd—Ni Alloy Composition in Weight % Pd* at Indicated Current Density | | | |
| --- | --- | --- | --- | --- |
| | 25 asf | 50 asf | 100 asf | $\Delta$ Wt % Pd |
| 0 | 67.9 | 76.5 | 84.6 | 16.7 |
| 15 | 80.2 | 84.5 | 88.0 | 7.8 |
| 100 | 81.1 | 83.2 | 85.3 | 4.2 |

*NOTE: Balance nickel.

EXAMPLE 17

This example illustrates the beneficial effect of iodate ion addition to a palladium-nickel plating bath with no organic brighteners in promoting constancy of alloy composition. Baths were formulated with the same lot of palladium diammine dichloride that was used in Example 16. Palladium-nickel alloy coatings were electrodeposited onto disks at current densities ranging from 25 to 100 asf from baths containing 15 and 100 ppm of iodate ions added as the sodium salt. The basic bath composition and operating conditions were as follows:

| Bath Chemistry | |
| --- | --- |
| Pd concentration: | 20 g/l as palladium diammine dichloride |
| Ni concentration: | 10 g/l as nickel ammine sulfate |
| Ammonium sulfate: | 50 g/l |
| Ammonium hydroxide: | quantity sufficient to achieve desired pH |
| Plating Conditions | |
| Temperature: | 48° C. |
| pH | 8.5 |
| Speed of disk rotation: | 500 rpm |

The $\Delta$ Wt% $Pd_{(100-25)}$ from the bath with the 15 ppm addition of iodate ions was 7.6 and that for the bath with a 100 ppm addition of iodate ions was 5.8. All coatings had a bright, mirror-like appearance indicating the iodate ions were performing the function of a brightener as well as that of a stabilizer of plated alloy composition.

While the above description and attached drawings illustrate certain embodiments of the present invention, it will be apparent that other embodiments and modifications may be made that are equivalent thereto to one skilled in the art. For example, combinations of iodide and iodate ion additions are also within the scope of this invention.

We claim:

1. An electroplating bath for plating a coating of palladium-nickel alloy on an electrically conductive substrate and which is capable of maintaining the palladium content of the plated alloy substantially constant, said bath comprising a palladium salt, a nickel salt and at least about 15 parts per million of iodate ions.

2. The bath of claim 1 further including a conductive salt and having a pH in the range between 7-9.

3. The bath of claim 2 wherein the palladium salt is palladium (II) ammine chloride, the nickel salt is selected from the group consisting of nickel ammine sulfate, nickel sulfate and nickel chloride and the conductive salt is ammonium sulfate.

4. The bath of claim 2 further including an organic brightener.

5. The bath of claim 4 wherein the organic brightener is sodium vinyl sulfonate.

6. The bath of claim 1, further including iodide ions.

7. A process for plating a coating of palladium-nickel alloy on an electrically conductive substrate wherein the palladium content of the alloy remains substantially constant, said process comprising the steps of:
   (a) immersing the electrically conductive substrate in an electroplating bath comprising a palladium salt, a nickel salt and at least 15 parts per million of iodate ions;
   (b) applying plating current to the bath wherein the current density on the conductive substrate is in the range of about 10 amps/sq.ft. to about 150 amps/sq.ft; and
   (c) depositing a coating of palladium-nickel alloy on said substrate having a palladium content which varies less than 10 in weight percent over the current density range applied.

8. The process of claim 7 wherein the current density on the conductive substrate is in the range of about 25 amps/sq.ft. to about 100 amps/sq.ft.

9. The process of claim 8 wherein the current density on the conductive substrate may vary by as much as a factor of four.

10. The process of claim 7 wherein the bath contains an organic brightener.

11. The process of claim 7 wherein iodide ions are also present in the bath.

* * * * *